United States Patent
Muramatsu et al.

(10) Patent No.: US 6,542,374 B1
(45) Date of Patent: Apr. 1, 2003

(54) CIRCUIT BOARD, METHOD FOR MANUFACTURING THE CIRCUIT BOARD, AND DISPLAY DEVICE AND ELECTRONIC EQUIPMENT EMPLOYING THE CIRCUIT BOARD

(75) Inventors: Eiji Muramatsu, Toyoshina-machi (JP); Kogo Endo, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/467,257

(22) Filed: Dec. 20, 1999

(30) Foreign Application Priority Data

| Dec. 21, 1998 | (JP) | 10-362587 |
| Feb. 4, 1999 | (JP) | 11-027305 |
| Nov. 26, 1999 | (JP) | 11-335852 |

(51) Int. Cl.[7] .............. H05K 7/02; H05K 7/06; H05K 7/08; H05K 7/10
(52) U.S. Cl. .............. 361/760; 361/761; 361/762; 361/764; 361/777; 361/767; 257/669
(58) Field of Search .............. 361/760, 761–762, 361/764, 783, 816, 749, 820, 748, 767, 768, 777, 772; 174/35.51 R; 438/926; 257/669

(56) References Cited

U.S. PATENT DOCUMENTS

| 4,644,411 | A | * | 2/1987 | Sato et al. .............. 250/208.1 |
| 4,758,896 | A | * | 7/1988 | Ito .............. 358/236 |
| 4,999,742 | A | * | 3/1991 | Stampfli .............. 336/200 |
| 5,285,352 | A | * | 2/1994 | Pastore et al. .............. 361/707 |
| 5,767,446 | A | * | 6/1998 | Ha et al. .............. 174/52.4 |
| 6,037,656 | A | * | 3/2000 | Sugahara .............. 257/697 |
| 6,147,724 | A | * | 11/2000 | Yoshii et al. .............. 349/62 |

* cited by examiner

*Primary Examiner*—David Martin
*Assistant Examiner*—Thanh T. Tran
(74) *Attorney, Agent, or Firm*—Harness, Dickey & Pierce, P.L.C.

(57) ABSTRACT

A FPC board 400 is manufactured by patterning copper foils which are bonded onto both sides of a base film 410 having insulation and flexibility without an adhesive layer, and forming an input wiring 420a and an output wiring 420b on a mounting surface of an electronic component while forming a dummy wiring layer 422 on the surface opposite the mounting surface. A dummy wiring layer 422 is set to be slightly larger than an area where an IC chip 450 is mounted, and has moisture resistance and light shielding properties. An input electrode 450a of the IC chip 450 is electrically connected to the input wiring 420a and an output electrode 450b is electrically connected to the output wiring 420b through electrically conductive particles 460a dispersed into an adhesive agent 460, such as an epoxy resin, at an appropriate ratio, and the adhesive agent 460 encapsulates the connection regions.

27 Claims, 9 Drawing Sheets

DIRECTION OF COLUMNS

DIRECTION OF ROWS

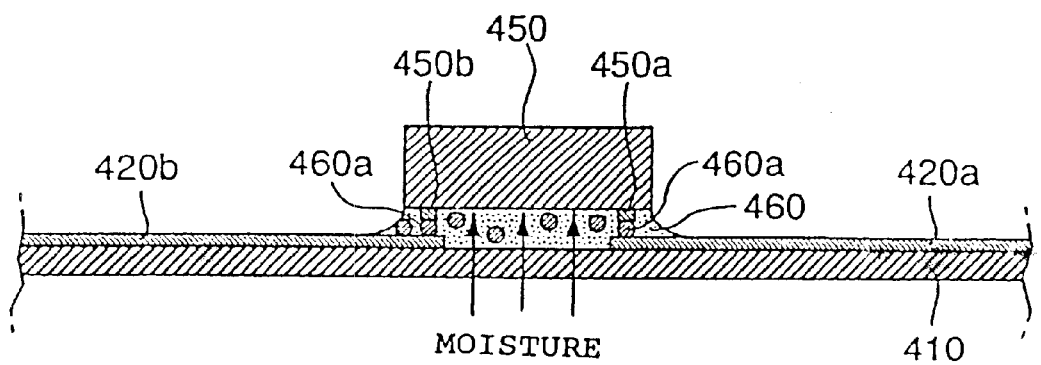
Fig. 10  *Prior Art*

CIRCUIT BOARD, METHOD FOR MANUFACTURING THE CIRCUIT BOARD, AND DISPLAY DEVICE AND ELECTRONIC EQUIPMENT EMPLOYING THE CIRCUIT BOARD

FIELD OF THE INVENTION

The present invention relates to a circuit board on which an electronic component is mounted, a method for manufacturing the circuit board, and a display device and electronic equipment employing the circuit board.

DESCRIPTION OF THE RELATED ART AND PROBLEMS TO BE SOLVED BY THE INVENTION

A technology for directly mounting electronic components, such as IC chips, on a FPC (Flexible Printed Circuit) board is currently in use to keep pace with a current trend to a smaller, thinner, and lighter board, to meet a bendable design requirement, and to accomplish high yield using a roll-to-roll process. Since such a technology does not need inner leads, unlike the TAB (Tape Automated Bonding) technology, thin copper foils work, and the promotion of fine pitch design in wiring is easy.

FIG. 10 is a cross-sectional view showing a conventional structure in which an electronic component is mounted on an FPC board. As shown, an input electrode 450a of an IC chip 450 and an input wiring 420a beforehand formed on the base film 410 are electrically connected to each other through electrically conductive particles 460a dispersed within an adhesive agent 460. Similarly, an output electrode 450b of the IC chip 450 and an output wiring 420b beforehand formed on the base film 410 are electrically connected to each other through electrically conductive particles 460a dispersed within an adhesive agent 460.

Since the base film 410, as a base material for the FPC board, typically contains organic film, such as PI (polyimide), which is pervious to moisture, moisture penetrates from the side (the IC chip mounting surface of the FPC)(the underside in FIG. 10) opposite a mounting side into the base film 410 and reaches a wiring formation plane (active surface of IC chip 450) of the IC chip 450. For this reason, the reliability of the IC chip is compromised, or light leakage of light transmitted through the base film 410 degrades the reliability of the IC chip. This disadvantage becomes more pronounced if the base film 410 is made thinner.

The present invention has been developed in view of the above problems, and it is an object of the present invention to provide a circuit board, including an electronic component and an wiring board, that prevents a drop in the reliability and performance of the electronic component, such as a mounted IC chip, a method for manufacturing the circuit board, and a display device and electronic equipment employing the circuit board.

SUMMARY OF THE INVENTION (1) A circuit board of the present invention includes a wiring board including a base material having insulation and flexibility, and a wiring layer arranged on the base material, and an electronic component electrically connected to the wiring layer and mounted on the wiring board, and a covering section for covering the base material on the side opposite the mounting side of the electronic component, in an area which, at least, partly overlaps a mounting area of the electronic component in a plan view, wherein the covering section is electrically isolated from the wiring layer and the electronic component and has moisture resistance.

In accordance with the present invention, moisture penetrating through the base material from the side opposite the mounting side of the electronic component is fully blocked by the covering section. This arrangement reduces the possibility that moisture penetration degrades the reliability and performance of the electronic component and the wiring layer in the area of the wiring board where the electronic component is mounted. When the electronic component, typically a semiconductor device such as an IC chip, is mounted on the wiring board, the circuit board is subject to short circuits and half-short/half-open circuits under the effect of moisture, because the pitches of a wiring pattern of the wiring board in the mounting area are typically fine. The circuit board of the present invention reduces the creation of such a problem.

(2) In a circuit board of the present invention, the covering section is a dummy wiring layer.

In accordance with the present invention, the covering section is constructed using the same facility that is used to construct the wiring layer.

(3) In a circuit board of the present invention, the covering section is a resin layer.

(4) In a circuit board of the present invention, the covering section has a light shielding property.

In accordance with the present invention, the covering section completely shields light penetrating through the base material from the side opposite the mounting area of the electronic component. This arrangement reduces a drop in the performance of the electronic component mounted on the wiring layer due to a light leakage.

(5) A circuit board of the present invention further includes a resin encapsulation section for encapsulating, by resin, the area where the electronic component and the wiring layer are electrically connected to each other.

In accordance with the present invention, the resin encapsulation section encapsulates, by resin, the area where the electronic component and the wiring layer are electrically connected to each other. This arrangement reduces the possibility that the reliability of the area where the electronic component and the wiring layer are electrically connected to each other is degraded under the influence of moisture.

(6) A circuit board of the present invention, according to one of (1) through (4), further includes an anisotropic conductive film, interposed between the electronic component and the wiring layer, for electrically connecting the electronic component to the wiring layer.

If the electronic component is bonded to the wiring board using the anisotropic conductive film in this way, a bonding step and a molding step in the TAB (Tape Automated Bonding) mounting are carried out in a single step, and the manufacturing process is advantageously shortened.

(7) In a circuit board of the present invention, the base material and the wiring layer are bonded together with no intervening adhesive layer interposed therebetween.

When the wiring layer is directly connected to the base material without any intervening adhesive layer in this way, the circuit board is free from a current leakage due to the adhesive agent and a swelling of the adhesive agent, and the flexibility of the wiring board is increased.

(8) In a circuit board of the present invention, according to one of (1) through (7), the base material includes a plurality of layers, and the covering section is arranged between the plurality of the layers.

The circuit board is a multi-layered board in which a base material is made up of a plurality of layers, and the covering section is arranged between layers of the base material. With the covering section arranged between the plurality of the layers, the area of the covering section is easily set to be equal to or larger than the bonding area of the electronic component. When the area of the covering section is set to be equal to or larger than the bonding area of the electronic component, the possibility of the penetration of moisture and light from outside the covering section is further reduced.

(9) A display device of the present invention includes one of the above-described circuit boards, and a flat panel including a connection terminal to which the circuit board is electrically connected.

(10) In a display device of the present invention, the flat panel is a liquid-crystal panel including a pair of opposing substrates, and a liquid crystal encapsulated between the pair of substrates, and the connection terminal is formed at least on one of the pair of substrates.

(11) In a display device of the present invention, the electronic component mounted on the circuit board includes a drive semiconductor device.

(12) Electronic equipment of the present invention includes a display device according to (11), and a video signal processing circuit for processing a video signal input to the display device.

(13) A method of the present invention for manufacturing a circuit board according to one of (1) through (7) includes an electronic component mounting step for mounting the electronic component onto the front side of the wiring board through pressure bonding, and a covering section forming step for forming the covering section on the back side of the wiring board, subsequent to the electronic component mounting step.

In accordance with the present invention, the covering section is formed on the back side of the wiring board after the electronic component is mounted onto the front side of the wiring board through pressure bonding, and the covering section thus reinforces the base material of the wiring board that might have been damaged in the course of the mounting of the electronic component through pressure bonding. This arrangement reduces the possibility of the penetration of moisture from the back side of the wiring board, and thus reduces the possibility that moisture penetrating from the back side of the wiring board is transmitted through the base material and causes any problems in the mounting area of the electronic component. These problems may include a short circuit or a half-short/half-open circuit, for example.

(14) A method of the present invention for manufacturing a circuit board according to one of (1) through (7), includes a covering section forming step for forming the covering section on the back side of the wiring board, and an electronic component mounting step for mounting the electronic component onto the front side of the wiring board through pressure bonding, subsequent to the covering section forming step.

In accordance with the present invention, the electronic component is mounted onto the front side of the wiring board through pressure bonding, after the covering section is formed on the back side of the wiring board. Since the wiring board is reinforced by the covering section formed on the back side of the wiring board, there is less possibility that the base material of the wiring board is damaged in the course of the mounting of the electronic component through pressure bonding. This arrangement reduces the possibility of the penetration of moisture from the back side of the wiring board, and thus reduces the possibility that moisture penetrating from the back side of the wiring board is transmitted through the base material and causes any problems in the mounting area of the electronic component. These problems may include a short circuit or a half-short/half-open circuit, for example.

BRIEF DESCRIPTION OF THE DRAWINGS

FIGS. 9(A), 9(B) and 9(C) are external views of examples of electronic equipment which incorporates, as its display unit, the display device of the third embodiment, wherein FIG. 9(A) shows a portable telephone, FIG. 9(B) shows a wristwatch, and FIG. 9(C) shows a portable information device.

FIG. 10 is a cross-sectional view showing a conventional circuit board.

DETAILED DESCRIPTION OF THE PREFERRED EMBODIMENTS

Figure 1:
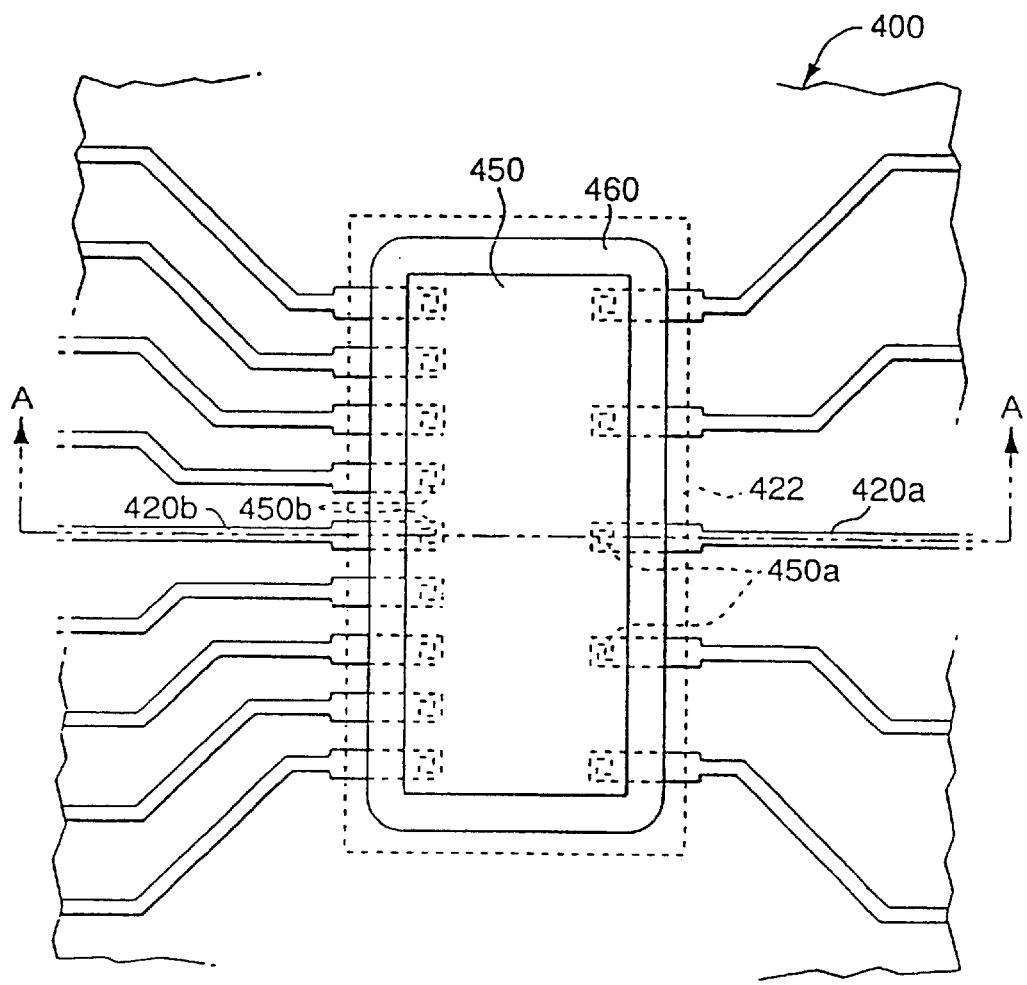
FIG. 1 is a plan view showing a circuit board of a first embodiment of the present invention.

The preferred embodiments of the present invention are more specifically discussed, referring to the drawings.

1. First Embodiment 1.1 Circuit Board

Figure 2:
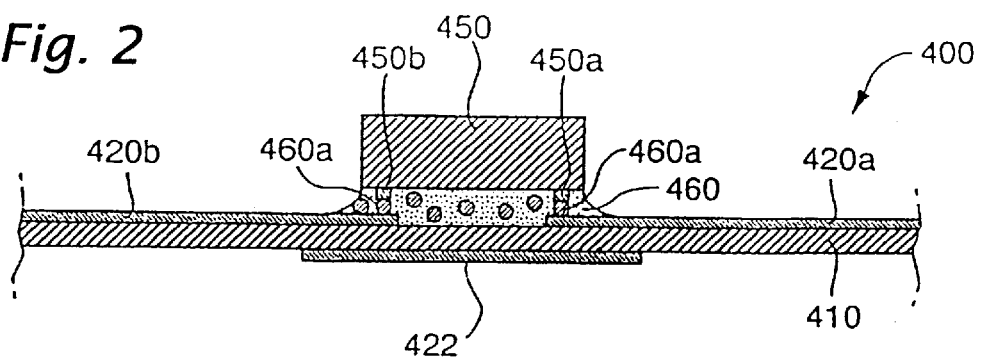
FIG. 2 is a cross-sectional view of the circuit board taken along line A—A in FIG. 1.

Discussed now is a circuit board in accordance with a first embodiment of the present invention. FIG. 1 is a plan view showing the circuit board, and FIG. 2 is a cross-sectional view of the circuit board taken along line A—A in FIG. 1. As shown in these figures, a FPC (Flexible Printed Circuit) board 400, as a wiring board, is manufactured, first by forming a copper film on both sides of a base film 410, as a base material, having insulation and flexibility, through sputtering or deposition process, second by patterning the copper film to a predetermined shape through known photolithographic process or etching process, and third by plating the patterned copper film with copper. The FPC board 400 may be a wiring board which is manufactured by applying polyamic acid, which is a precursor of polyimide, on a copper foil, and by thermally polymerizing the polyamic acid coated copper foil for imidization. The wiring board is thus produced with the resulting polyimide working as the base film 410.

A wiring board, as the FPC board 400, may be produced by laminating copper foils on both sides of a base film 410 using an adhesive agent, and then by patterning the copper foils to a predetermined shape. As already discussed, however, the wiring board on which the wiring pattern is directly formed on the base film 410 is advantageous in that the wiring board is free from a current leakage between adjacent wiring patterns through the adhesive agent and free from a swelling of the bonding adhesive agent, and that the flexibility of the FPC board 400 is increased.

Besides the polyimide, other organic film such as polyethylene terephtalate or polyester may be used for the base film 410 as the base material. The wiring pattern formed on the FPC board 400 includes an input wiring 420a for inputting a signal to an IC chip 450, an output wiring 420b for receiving an output signal from the IC chip 450, and a dummy wiring layer 422 as the covering section.

A rectangular parallelopiped IC chip 450 (semiconductor device), as an electronic component, has a plurality of input electrodes 450a and a plurality of output electrodes 450b on one surface along its periphery. With its surface bearing the input electrodes 450a and the output electrodes 450b facing downward, the IC chip 450 is mounted onto the FPC board 400. Each of the input electrodes 450a and the output electrodes 450b is beforehand formed of a bump (a projected electrode) of Au, for example. Interposed between the IC chip 450 and the FPC board 400 is an anisotropic conductive film 460, which is formed by uniformly dispersing electrically conductive particles 460a in an adhesive agent of epoxy. The IC chip 450 is thereafter heated and pressed onto the FPC board 400 with the anisotropic conductive film therebetween to be bonded onto the FPC board 400. A circuit board is thus produced by mounting the IC chip 450 as an electronic component onto the FPC board 400 as a wiring board.

Referring to FIG. 2, in the mounting operation, the input electrodes 450a are respectively electrically connected to input wirings 420a and the output electrodes 450b are respectively electrically connected to output wirings 420b, using electrically conductive particles 460a which are dispersed at a proper ratio into the adhesive agent 460, such as an epoxy resin or a photo-curing resin. The adhesive agent 460 is also an encapsulation material working as a resin encapsulation section which protects the surface of the IC chip 450 having the input electrodes 450a and the output electrodes 450b from moisture, contamination, and stress.

When the IC chip 450 and the FPC board 400 are bonded to each other using the anisotropic conductive film 460, the bonding step and the molding step in the conventional TAB mounting operation are carried out in a single step, thereby advantageously shortening the manufacturing process.

The dummy wiring layer 422 as the covering section in this embodiment is formed on the side opposite the mounting surface, in the area slightly larger than the area where the IC chip 450 is mounted. For this reason, as shown in FIG. 2, moisture penetrating from the back side (the surface opposite the mounting surface) of the base film 410 is completely blocked by the dummy wiring layer 422. This arrangement prevents the reliability degradation of the IC chip 450 mounted on the FPC board 400. Like moisture, light penetrating from the back side of the base film 410 is completely blocked by the dummy wiring layer 422 as shown and is unable to enter the surface (active surface) having the input electrodes 450a and the output electrodes 450b in the IC chip 450, and the performance degradation of the IC chip 450 due to a light leakage is thus prevented.

In the above embodiment, the connection between the input electrode 450a and the input wiring 420a, and the connection between the output electrode 450b and the output wiring 420b are performed by the electrically conductive particles 460a dispersed into the adhesive agent 460, namely, by the anisotropic conductive film, but other connection methods are also acceptable. For example, the copper foil, forming the input wiring 420a and the output wiring 420b, may be plated with Au, and Au-plated wirings may be connected to Au bumps of the input electrode 450a and the output electrode 450b of the IC chip 450 to form Au—Au connections. Alternatively, the foil, forming the input wiring 420a and the output wiring 420b, is plated with tin, and the tin-plated wirings are then connected to the Au bumps of the input electrode 450a and the output electrode 450b of the IC chip 450 through contact heating to form Au—Sn eutectic bonding. Alternatively, the copper foil, forming the input wiring 420a and the output wiring 420b, is patterned to be ready for soldering, and the bumps of the input electrode 450a and the output electrode 450b of the IC chip 450 are formed of solder to form solder-solder connections. In this case, an encapsulation material for the resin encapsulation section is used to mold around the IC chip 450.

The electronic component mounted onto the FPC board 400 is not limited to the IC chip 450. For example, the electronic component mounted onto the FPC board 400 may be other active or passive element, as long as the element which is subject to moisture and light penetrating through the base film 410, when mounted on the FPC board 400.

The adhesive film, containing the electrically conductive particles 460a dispersed therewithin, may be clumped to only the input electrode 450a and the output electrode 450b of the IC chip 450. After the input electrode 450a is connected to the input wiring 420a, and the output electrode 450b is connected to the output wiring 420b, an encapsulation material for the resin encapsulation section is molded around these connections.

Since the dummy wiring layer 422 serves no wiring purposes, a capacitor is inconveniently created if no potential is set to it. For this reason, the dummy wiring layer 422 is preferably connected to a wiring at the ground potential.

1.2 Display Device

As described above, when the IC chip 450 is mounted on the FPC board 400, the time required for the mounting process is constant regardless of the number of connection electrodes of the IC chip 450, in contrast to the wire bonding method. For this reason, manufacturing yield is substantially increased when the number of electrodes of the IC chip 450 is high. An example of an IC chip having a large number of electrodes is a drive circuit (driver) for driving data lines and scanning lines in a display device. Discussed as an application of the mounting structure is a liquid-crystal device having an FPC board with a driver mounted thereon.

Figure 3:
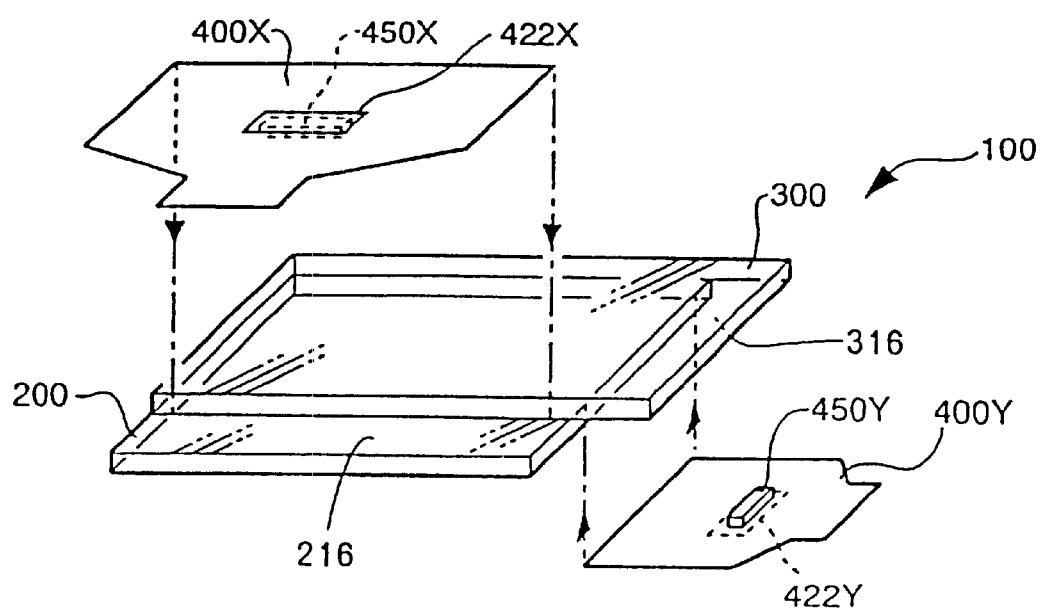
FIG. 3 is an exploded perspective view showing two FPC board having the structure shown in FIG. 1 and FIG. 2 and a liquid-crystal panel.

Referring to FIG. 3, a liquid-crystal device includes a liquid-crystal panel 100, two FPC boards 400X and 400Y connected to the liquid-crystal panel 100, and a control circuit board (not shown) connected to the FPC boards 400X and 400Y. The liquid-crystal panel 100 has a structure in which a device substrate 200 having a plurality of data lines formed thereon is bonded to an opposing substrate 300 having a plurality of scanning lines formed thereon, with the electrode formation surfaces of the two substrates facing each other and with their terminal areas 216 and 316 projected.

Figure 4:
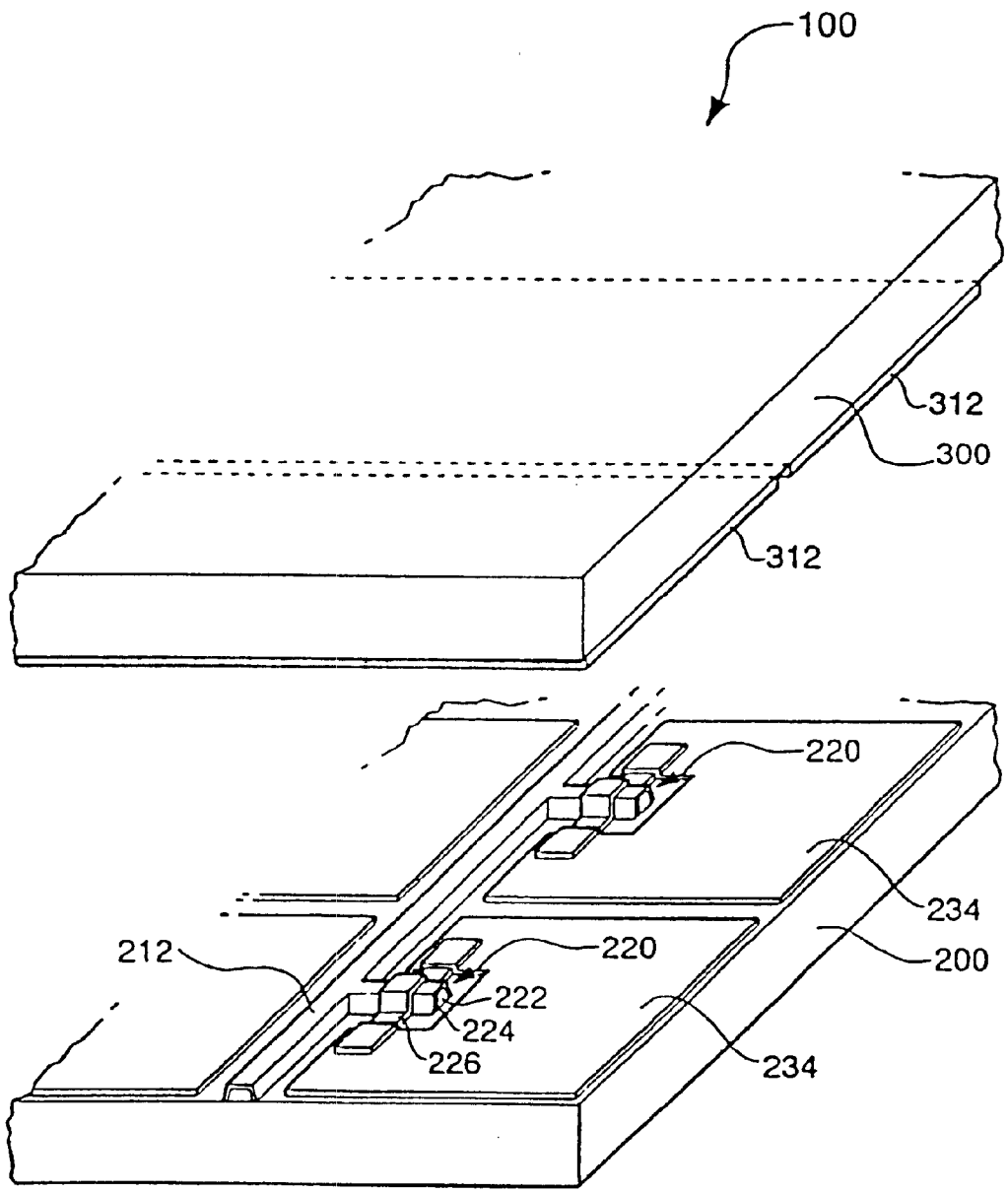
FIG. 4 is a perspective view of the liquid-crystal panel of the first embodiment, with its panels partially broken away.
Figure 4:

As shown in more detail in FIG. 4, the device substrate 200, on its surface facing the opposing substrate 300, includes a plurality of pixel electrodes 234 arranged in a matrix, and data lines (signal lines) 212, each extending in the direction of columns. Pixel electrodes 234 on each column are connected to a single data line 212 via TFD (Thin Film Diode) devices 220. The TFD device 220, if viewed from the substrate, includes a first metal film 222, an oxide film 224, which is produced by anodizing the first metal film 222, and a second metal film 226, and has thus a sandwich structure of a metal/insulator/metal. For this reason, the TFD device 220 has a switching characteristic as a positive-negative two-way diode.

The opposing substrate 300, on its surface facing the device substrate 200, includes scanning lines 312 which are arranged, in the direction of rows perpendicular to the data lines 212, as electrodes opposing pixel electrodes 234, and color filters, although not shown, respectively opposing the pixel electrodes 234. A single liquid-crystal cell, corresponding to one pixel, is thus constructed of a pixel electrode 234, a scanning line 312 as an opposing electrode, and a liquid crystal encapsulated in the gap between both substrates.

A constant gap (space) is maintained between the device substrate 200 and the opposing substrate 300 with a sealing material applied on the peripheries of the substrates and with spacers appropriately dispersed therebetween, and a liquid crystal of TN (Twisted Nematic) type, for example, is encapsulated in the enclosed space by the sealing material. A rubbing processed alignment layer is arranged on the facing surface of each of the device substrate 200 and the opposing substrate 300, and a polarizer is arranged on the opposite surface of each substrate according to the alignment direction (the alignment layers and the polarizers are not shown). However, if a polymer dispersed liquid crystal, in which a liquid crystal in the form of fine particles is dispersed in a polymer, is used, the alignment layers and the polarizers are dispensed with. The use of the polymer dispersed liquid crystal achieves a high utilization of light, advantageously helping promoting high luminance and low-power consumption design.

In the above construction, each of the data lines 212 and each of the scanning lines 312 are electrically connected at each intersection via a serial connection of a liquid crystal and a TFD device 220 therebetween. For this reason, when a voltage above a threshold is applied to the TFD device 220 in response to a scanning signal applied to the scanning line 312 and a data signal applied to the data line 212, the corresponding TFD device is turned on, and the liquid crystal layer connected to the corresponding device stores a predetermined charge. When the device is turned off subsequent to the charge storage, the charge stored in the liquid crystal layer is maintained if a resistance of the liquid crystal layer is high enough. When the TFD device 220 is turned on or off to control the quantity of charge stored in this way, each pixel varies in its alignment state, presenting predetermined information. Since the duration during which the charge is stored in each pixel is permitted to be a fraction of one period, a time-division multiplex driving with each of the data line 212 and the scanning line 312 connected to a plurality of pixels is realized by selecting the scanning lines 312 in a time-division manner. The scanning line and the data lines are reversed so that the scanning lines are formed on the device substrate 200 and the data lines are formed on the opposing substrate 300.

Although not shown in FIG. 3, the terminal area 216 of the device substrate 200 has data line terminals, as connection terminals, from which respective data lines extend outwardly, while the terminal area 316 of the opposing substrate 300 has, on its underside, data line terminals, from which respective scanning lines extend outwardly.

The FPC boards 400X and 400Y have the construction of the above-referenced circuit board including the FPC board 400, the IC chip 450 and the dummy wiring layer 422. In the FPC board 400X, a driver 450X for driving the data lines is mounted as an IC chip in a direction upside down and inverted from that shown in FIG. 2. A dummy wiring layer 422X comes on the front side of the FPC board 400X as shown in FIG. 3. In the FPC board 400Y, a driver 450Y for driving the scanning lines is mounted as an IC chip in the same direction as that shown in FIG. 2. A dummy wiring layer 422Y is arranged on the under of the FPC board 400Y as shown in FIG. 3.

In the FPC board 400X, on one side, terminals respectively extending from the input wirings are connected to the control circuit board, while on another side, terminals respectively extending from the output wirings, are connected to the data line terminals formed on the terminal area 216 of the device substrate 200. Similarly, in the FPC board 400Y, on one side, terminals respectively extending from the input wirings are connected to the control circuit board, while on another side, terminals respectively extending from the output wirings are connected to the scanning line terminals formed on the terminal area 316 of the opposing substrate 300.

With the above construction, the driver 450Y produces a scanning signal in response to a control signal supplied by the control circuit board, and feeds the scanning signal to each scanning line in the opposing substrate 300. On the other hand, the driver 450X feeds a data signal to each data line in the device substrate 200 in response to a control signal supplied by the control circuit board. The dummy wiring layers 422X and 422Y, which are arranged at locations corresponding to the mounting areas of the drivers 450X and 450Y, prevent drops in the reliability and performance of drivers 450X and 450Y respectively mounted on the FPC boards 400X and 400Y, as already discussed.

Although the FPC boards 400X and 400Y have the structure of the first embodiment, the FPC boards 400X and 400Y alternatively have the structure in accordance with a second embodiment to be discussed later.

Besides this type of liquid crystal panel, the present invention is applied to a passive matrix liquid crystal panel having no TFD devices or a liquid crystal panel in which scanning lines and data lines are arranged on a device substrate with a pixel electrode connected via a TFT (Thin Film Transistor) device at each intersection of the scanning lines and the data lines.

1.3 Electronic Equipment

Figure 5:
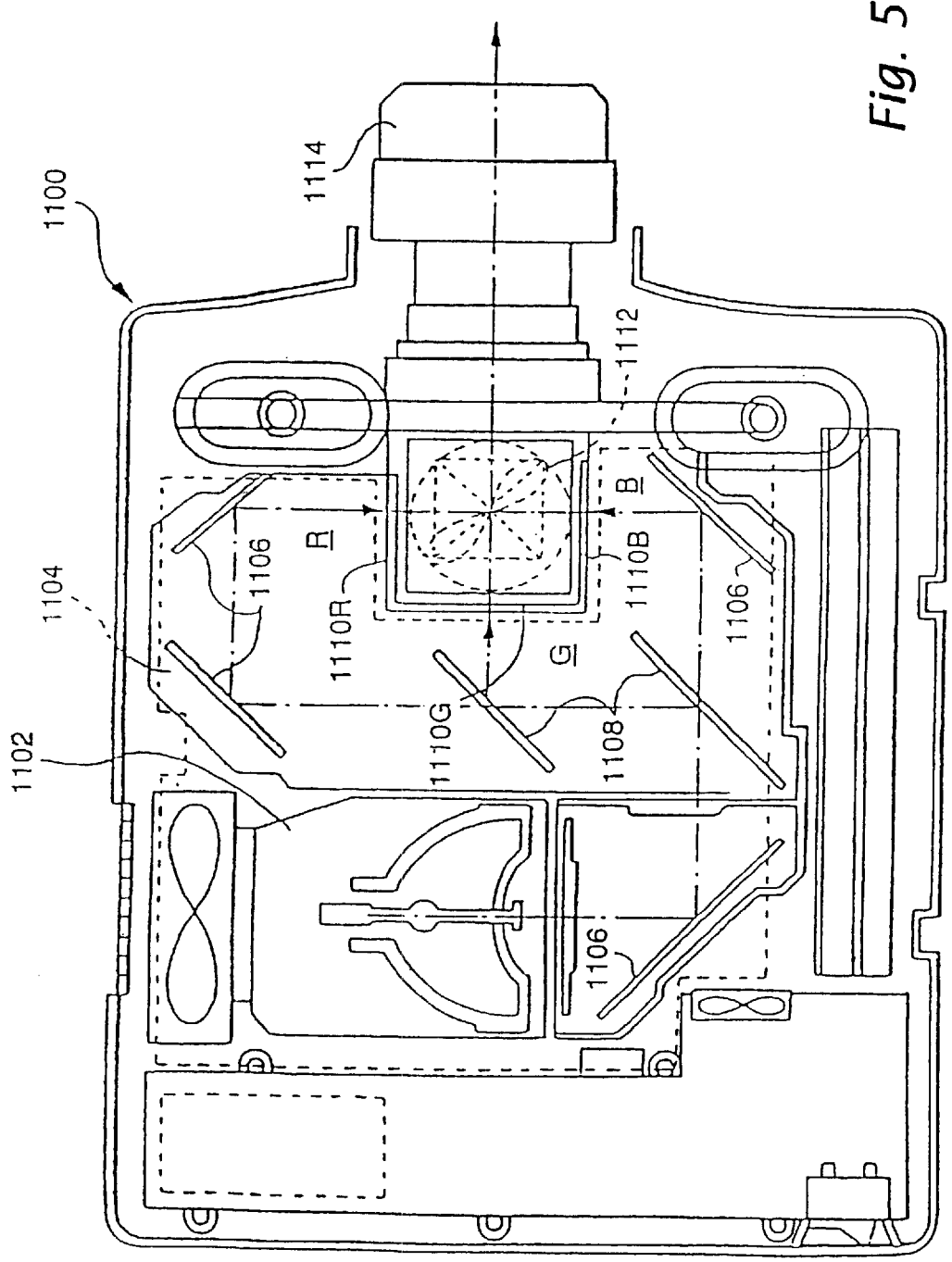
FIG. 5 is a sectional view showing the construction of a liquid-crystal projector as one example of electronic equipment that incorporates the liquid-crystal panel of the first embodiment.

Discussed next is an example of electronic equipment which employs the liquid-crystal panel of the liquid crystal device as its display unit. FIG. 5 is a plan view showing an example of the projector that employs a liquid-crystal panel as a light valve.

As shown, a projector 1100 includes a lamp unit 1102 composed of a white light source such as a halogen lamp. A light beam emitted from the lamp unit 1102 is separated through four mirrors 1106 and two dichroic mirrors 1108 in a light guide 1104 into the three primary colors RGB, which are respectively incident on liquid-crystal panels 1110R, 1110G, and 1110B, as light valves corresponding to the three primary colors.

The liquid-crystal panels 1110R, 1110G, and 1110B are the above-referenced liquid-crystal panels, and are driven by R, G, and B primary color signals supplied by a video signal processing circuit (control circuit) (not shown) via the FPC board 400X and the FPC board 400Y. Light beams, modulated through these liquid-crystal panels, are incident on a dichroic prism 1112 from three directions. In the dichroic prism 1112, the R and B light beams are refracted at a right angle, while the G light beam straightly travels.

The images of the three colors are synthesized into a color image, and the synthesized image is projected through a projection lens 1114 onto a screen or the like.

Since through the dichroic mirrors 1108, the liquid-crystal display panels 1110R, 1110G, and 1110B receive light beams corresponding to the three primary colors R, G, and B, it is not necessary to arrange color filters on the opposing substrate 300.

Besides the projector, examples of the equipment may be liquid-crystal display television, view-finder type, direct-monitor viewing type video tape recorder, car navigation system, electronic pocketbook, electronic calculator, wordprocessor, workstation, portable telephone, pager, video phone, POS (Point of Sales) terminal, and apparatus having a touch panel. The display device of the present invention may be applied to these pieces of electronic equipment.

2. Second Embodiment

The difference between a second embodiment of the present invention and the first embodiment lies in the structure of the circuit board in which the wiring board having the base material and the wiring layer includes the electronic component and the covering section. The rest of the construction of the second embodiment remains unchanged from that of the first embodiment, and the discussion about it is omitted here. In the figures, components identical to those described in connection with the first embodiment are designated with the same reference numerals.

Figure 6:
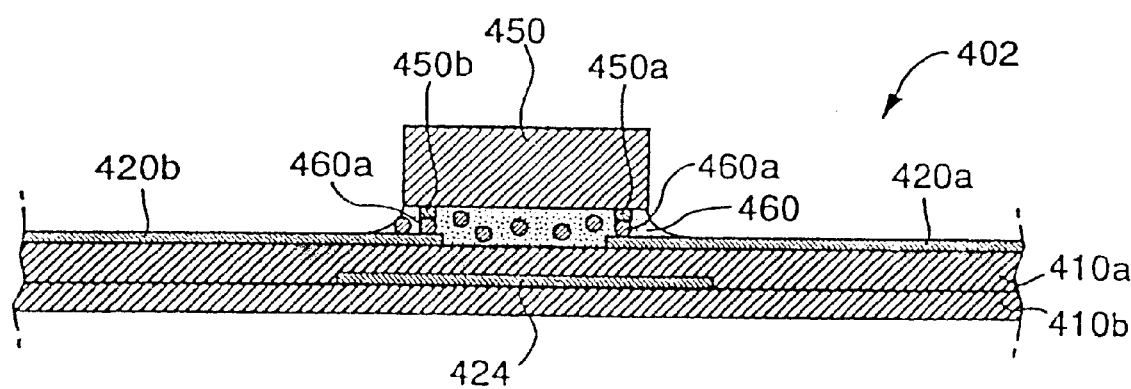
FIG. 6 is a cross-sectional view showing a circuit board of a second embodiment of the present invention, corresponding to FIG. 2 showing the first embodiment.

FIG. 6 is a cross-sectional view of the circuit board of this embodiment, and corresponds to FIG. 2 showing the first embodiment. An FPC board 402 is a multi-layered board including two layers of base films 410a and 410b, and a dummy wiring layer 424 as the covering section extends between the base films 410a and 410b, in an area slightly larger than the mounting area of an IC chip 450.

Like the first embodiment, moisture and light penetrating through the base film 410b from the side opposite the mounting side of the IC chip 450 are blocked by the dummy wiring layer 424, and the reliability degradation of the IC chip 450 and the performance degradation due to light leakage are prevented.

The number of the base films is not limited to two. Three or more films may be employed.

3. Third Embodiment

3.1 Liquid-crystal Device

Figure 7:
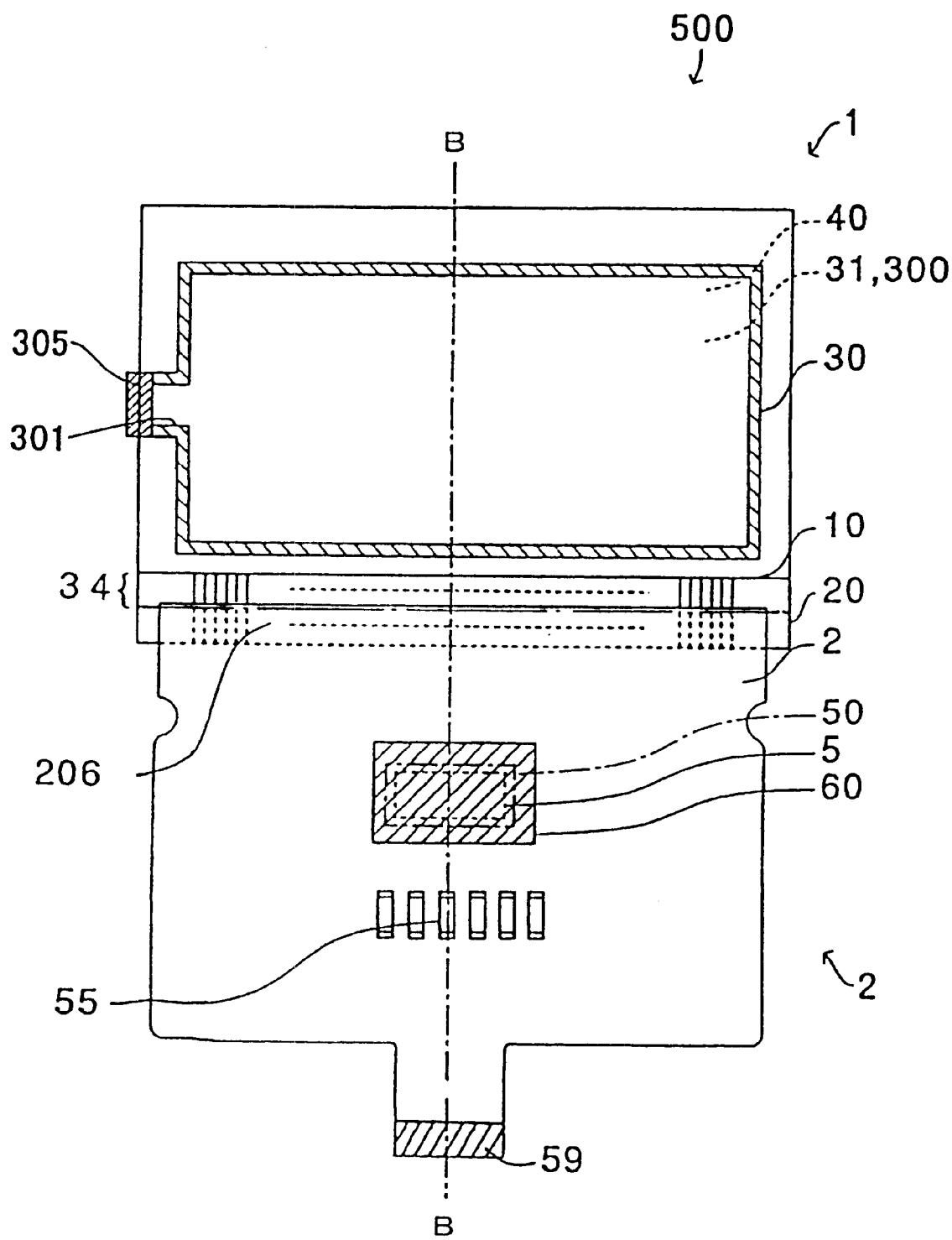
FIG. 7 is a plan view showing a liquid-crystal device of a third embodiment with wiring not shown.
Figure 8:
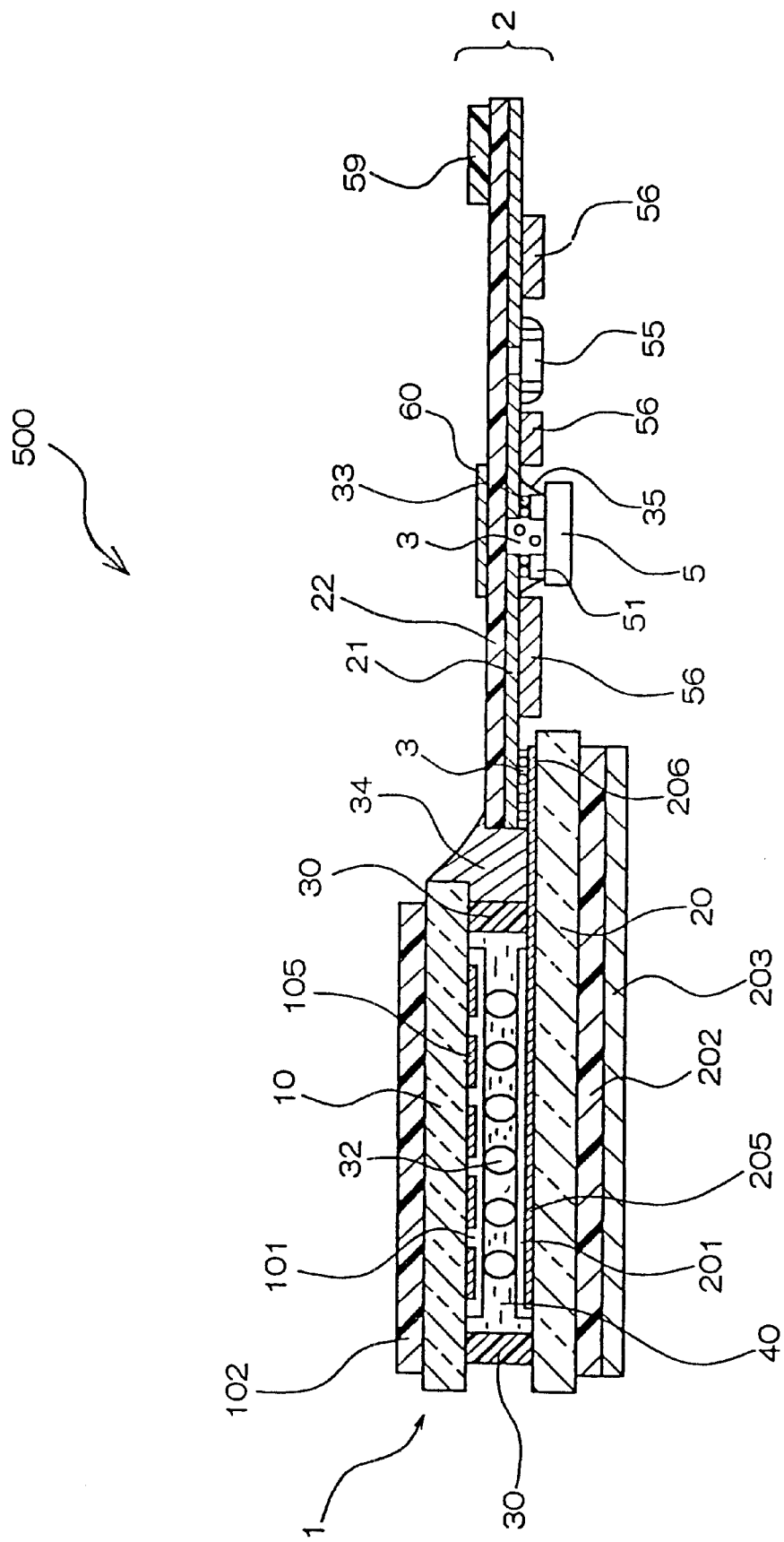
FIG. 8 is a cross-sectional view of the liquid-crystal device taken along line B—B in FIG. 7.

FIG. 7 is a plan view showing a liquid-crystal device of this embodiment, with its wiring pattern not shown. FIG. 8 is a cross-sectional view of the liquid-crystal device taken along line B—B in FIG. 7. Referring to FIG. 8, a liquid-crystal panel 1, used in a liquid-crystal device 500 as a display device of the present invention, includes a transparent substrate 10 constructed of a thin transparent glass plate, and a transparent substrate 20 similarly constructed of a thin transparent glass plate. A sealing material 30 is applied around the peripheries of the transparent substrates 10 and 20, and the transparent substrate 10 and the transparent substrate 20 are bonded and affixed to each other with a predetermined gap 31 (cell gap) maintained therebetween. The cell gap, namely, a space between the transparent substrate 10 and the transparent substrate 20 is defined by a number of spacers 32 interposed between the transparent substrate 10 and the transparent substrate 20.

Referring to FIG. 7, the sealing material 30 has a discontinuity section which serves as a liquid crystal inlet 301 through which a liquid crystal 40 is introduced. The liquid crystal inlet 301 is sealed with an encapsulation material 305 of an ultraviolet light curing resin after the liquid crystal 40 is vacuum-injected.

Referring to FIG. 8, the liquid crystal 40 is encapsulated in a region defined by the transparent substrate 10, the transparent substrate 20, and the sealing material 30. Striped electrodes 105 and 205 are respectively formed on the transparent substrates 10 and 20, and are respectively covered with alignment layers 101 and 201. The liquid-crystal panel 1 using the liquid crystal 40 in STN (Super Twisted Nematic) mode is thus provided.

Polarizers 102 and 202 are respectively bonded onto the external surfaces of the transparent substrate 10 and the transparent substrate 20. When the liquid-crystal panel 1 is constructed as a reflective type liquid-crystal panel 1, a reflective plate 203 is bonded onto the external surface of the polarizer 202 glued onto the transparent substrate 20.

As already discussed, the plurality of striped electrodes 105 horizontally extending on the internal surface of the transparent substrate 10 are constructed of transparent conductive ITO (Indium Tin Oxide) film. The plurality of striped electrodes 205 vertically extending on the internal surface of the transparent substrate 20 are constructed of transparent conductive ITO film. A pixel is formed at each intersection where each of the striped electrodes 105 and each of the striped electrodes 205 cross.

Since the transparent substrate 20 is larger than the transparent substrate 10, part of the transparent substrate 20 (terminal area) is projected from the lower edge of the transparent substrate 10. An FPC board 2, as a wiring board constituting the circuit board of the present invention, is connected to terminals 206 formed on the projected portion (terminal area) via an anisotropic conductive film 3. The terminals 206 for electrical connection are the extensions of the striped electrodes 205 formed on the transparent substrate 20 and wired (extended) to the projection portion and the striped electrodes 105, formed on the transparent substrate 10, extended through conductor members (not shown) for electrical connection between the transparent substrate 10 and the second transparent substrate 20, and arranged on the projected portion.

When a variety of control signals and drive signals such as power are input from an external circuit through the FPC board 2, desired and appropriate striped electrodes 105 and 205 are supplied with the voltage in response to the drive signal. The alignment state of the liquid crystal 40 at each pixel is controlled and thereby a desired image is presented on the liquid-crystal device 1. To input the drive signal, a drive IC 5 as an electronic component is mounted on the FPC board 2, thereby forming a circuit board. The FPC board 2 is produced by forming a nickel or gold covered copper wiring pattern 21 on the surface of a base film 22 (base material) of polyimide film as thin as 25 $\mu$m, and the drive IC 5 is mounted on the FPC board 2 with the anisotropic conductive film 3 interposed therebetween. A resin mold 34 is applied to a connection region between the FPC board 2 and the terminals 206, from the edge portion of the FPC board 2 to the edge portion of the liquid-crystal panel 1.

The drive IC 5 is COF (Chip On Film) mounted on the FPC board 2 using the anisotropic conductive film 3. The COF mounting is a known technology, and is not discussed in detail here. In this mounting operation, a pressure bonding head is used to heat and press the drive IC 5 with the anisotropic conductive film 3 interposed between the drive IC 5 and the FPC board 2. The anisotropic conductive film 3 is a sheet-like or paste-like resin 35 into which electrically conductive particles 33, which are formed by gold-plating plastic balls, are mixed. The fused resin 35 is pushed out from between terminals (input/output electrode) 51 of the drive IC 5 and a wiring pattern (input/output wiring) 21 of the FPC board 2, forming a resin encapsulation section. At the same time, the conductive particles 33 are pressed between the terminals 51 of the drive IC 5 and the wiring pattern 21 of the FPC board 2, thereby electrically connecting the terminals 51 of the drive IC 5 to the wiring pattern 21 of the FPC board 2. This mounting method not only works with a fine-pitch version of the wiring pattern 21 and the terminals 51, but also electrically connects a number of terminals 51 at a time.

Surface-mount type ceramic capacitor 55 is also mounted on the FPC board 2. A solder resist layer 56 is formed in areas on the surface of the FPC board 2 where no components are mounted. The FPC board 2 has, on its end portion, a wiring pattern of a terminal section of terminals that are electrically connected to a circuit board in a host apparatus such as a portable telephone, when the liquid-crystal device 500 is installed in the host apparatus. A reinforcing plate 59 is glued onto the area of the FPC board 2 opposite the area bearing the terminal section to reinforce the terminal section for connection.

In the IC mounting structure of the liquid-crystal device 1 thus constructed, a coating layer 60 as the covering section (a hatched area designated by reference numeral 60 as shown in FIG. 7) is formed on the back side of the FPC board 2 (i.e., the side of the base film 22), extending over the back side area corresponding to the IC mounting area 50. The circuit board of the present invention is thus constructed. Specifically, the coating layer 60 is formed on the surface of the FPC board 2 opposite the surface on which the drive IC 5 is mounted, in the rear area (which coexpands in a plan view) corresponding to the area (mounting area) where the drive IC 5 is mounted. The coating layer 60 has an area at least larger than the IC mounting area 50 by a peripheral area as wide as at least 0.1 mm across. The coating layer 60 is a resin layer having high moisture resistance, such as an epoxy resin. In the IC mounting structure of this embodiment, the base film 22 of the FPC board 2 is as thin as 25 μm, and wiring pitch in the area (IC mounting area 50) where the drive IC 5 is COF-mounted on the FPC board 2 is 50 μm, in contrast to 70 μm in the conventional art. Furthermore, there is a possibility that the base film 22 is damaged when the drive IC 5 is mounted using the anisotropic conductive film 3 in the course of pressure bonding. Regardless of these conditions that moisture easily penetrates from the back side of the base film 22 and the drive IC 5 suffers from moisture, the circuit board of the present invention prevents moisture from penetrating from the back side of the FPC board 2 with the coating layer 60. With this arrangement, no moisture penetrates from the back side of the FPC board 2, and is transmitted through the base film 22, and therefore, no short circuits nor half-short/half-open circuits take place between wiring patterns 21 having a fine pitch in the IC mounting area 50.

To construct such IC mounting structure, the coating layer 60 larger than the IC mounting area 50 by a peripheral area wider than at least 0.1 mm thereacross, is formed on the back side of the FPC board 2 after the drive IC 5 is pressed onto the anisotropic conductive film 3 against the front surface of the FPC board 2 through pressure bonding in this embodiment. With this arrangement, the coating layer 60 reinforces the base film 22 of the FPC board 2 that might have been damaged when the drive IC 5 was mounted through pressure bonding, while preventing moisture from penetrating through the base film 22.

3.2 Electronic Equipment Incorporating the Liquid-crystal Device

Figure 9A:
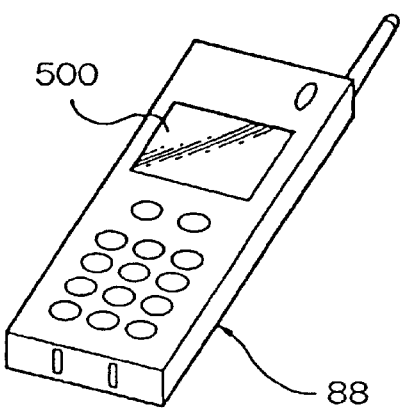
Figure 9B:
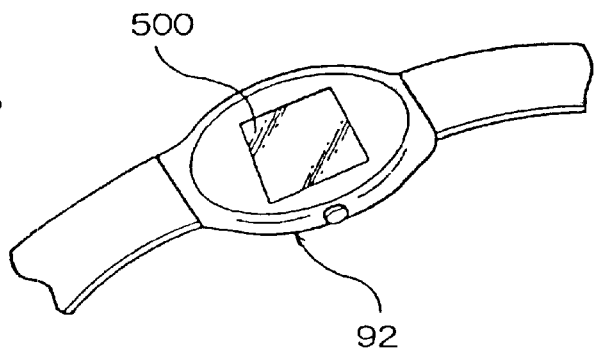
Figure 9C:
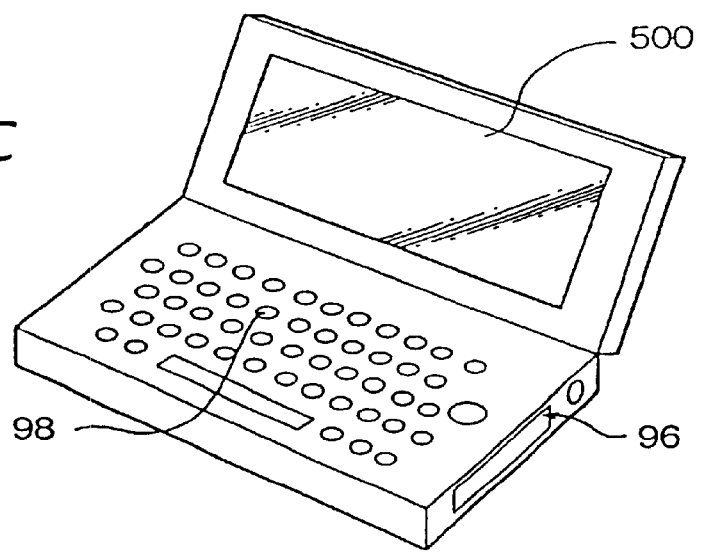

FIGS. 9(A), 9(B), and 9(C) are external views showing examples of electronic equipment that incorporates the liquid-crystal device 500 of this embodiment. FIG. 9(A) shows a portable telephone 88, including the liquid-crystal device 500 on its top front side. FIG. 9(B) shows a wristwatch 92 including, on its center, a display of the liquid-crystal device 500. FIG. 9(C) is a portable information device 96, including a display device of the liquid-crystal device 500 and an input section 98. Although not shown, these pieces of equipment include, besides the liquid-crystal device 500, a display signal generating section including a variety of circuits such as a display information output source, a display information processing circuit, and a clock generating circuit, and a power source circuit for feeding power to these circuits. The display device presents images when the display signal generating section feeds a display signal in response to information input through the input section 98, for example, in the portable information device 96.

Electronic equipment that incorporates the liquid-crystal device 500 of this embodiment is not limited to the portable telephone, wristwatch, and portable information device. Also contemplated as host equipment are notebook personal computer, electronic pocketbook, pager, electronic calculator, POS terminal, IC card, mini-disc player, etc.

4. Fourth Embodiment

The circuit board of this embodiment and the liquid-crystal device employing the circuit remain unchanged from those of the third embodiment in construction, and the discussion of the construction is omitted here.

The difference of this embodiment from the third embodiment lies in the following mounting method in which an IC (Integrated Circuit) is mounted to manufacture the liquid-crystal device having the structure described with reference to FIG. 7 and FIG. 8.

Specifically, in this embodiment, the coating layer 60 larger than a planned area, where the drive IC 5 is to be mounted (IC mounting area 50), by a peripheral area wider than at least 0.1 mm thereacross, is formed on the back side of the FPC board 2 before the drive IC 5 is bonded onto the anisotropic conductive film 3 against the top surface of the FPC board 2. The coating layer 60 is here again a high moisture resistance resin layer, such as of an epoxy resin, as in the third embodiment.

A pressure bonding head (not shown) is used to heat and press the drive IC 5 with the anisotropic conductive film 3 interposed between the drive IC 5 and the top surface of the FPC board 2, to mount the drive IC 5.

In such an IC mounting method, the base film 22 of the FPC board 2 is protected by the already formed coating layer 60, and there is less possibility that the base film 22 is damaged in the course of pressure bonding. Since the coating layer 60 is formed on the back side of the FPC board 2, moisture is prevented from penetrating the back side of the FPC board 2. With this arrangement, no moisture penetrates from the back side of the FPC board 2, and is transmitted through the base film 22, and therefore, no short circuits nor half-short/half-open circuits take place between wiring patterns 21 having a fine pitch in the IC mounting area 50.

5. Modifications

Modifications applicable to the above-referenced embodiments are discussed. In the discussion of the following modifications, only the difference from each of the above-referenced embodiments is described.

5.1 In some of the above-referenced embodiments, the liquid crystal panel is an active matrix addressing liquid-crystal panel having an encapsulated liquid crystal with a TN type electro-optical characteristic, employing TFD (Thin Film Diode) as a two-terminal switching element, or a passive matrix addressing liquid-crystal panel having an encapsulated liquid crystal with an STN (Super Twisted Nematic) type electro-optical characteristic. The liquid-crystal panel is not limited to these. From the standpoint of driving method, employed as the liquid-crystal panel are a static driving liquid-crystal panel, an active matrix addressing liquid-crystal panel with a three-terminal switching device, such as a TFT (Thin Film Transistor), or a two-terminal switching device, such as an MIM (Metal-Insulator-Metal). From the standpoint of electro-optical characteristics, a diversity of liquid-crystal display panels may be employed including the one of a guest-host type, a phase-change type, a ferroelectric type, BTN type employing a bistable twisted nematic liquid crystal having memory function.

5.2 The flat display panel employed in the present invention is not limited to the liquid-crystal panel. The flat display panel employed in the present invention may also be an EL (Electro-Luminescence) display panel, a PDP (Plasma Display Panel) panel, or an FED (Field Emission Display) panel.

5.3 In each of the above-referenced embodiments, the semiconductor device as a driver circuit is mounted on the circuit board, and the circuit board is then connected to the flat display panel. The circuit board of the present invention connected to the flat display panel may include at least one of the semiconductor device of the driver circuit, the semiconductor device for the video signal processing circuit, and the semiconductor device for other circuit.

5.4 The present invention is not limited to the above-referenced embodiments. A diversity of changes is possible within the scope of the present invention and within the scope of equivalents defined in the claims.

What is claimed is:

1. A circuit board comprising:
   a wiring board including a base being pervious to moisture;
   an electronic component mounted on the base, said electronic component having an active surface, said electronic component having an electrode arranged within said active surface;
   a wiring arranged on the base extending within said active surface and connected to said electrode;
   an adhesive agent disposed between said base and said active surface;
   a conductive particle mixed in said adhesive agent, said conductive particle electrically connecting said electrode and said wiring; and
   a covering section covering the base on the side opposite the mounting side of the electronic component, in an area which, at least, partly overlaps said active surface so as to prevent moisture from reaching said active surface through the base, the covering section being electrically isolated from the wiring and the electronic component.

2. A circuit board according to claim 1, wherein the covering section is a dummy wiring layer.

3. A circuit board according to claim 1, wherein the covering section is a resin layer.

4. A circuit board according to claim 1, wherein the covering section has a light shielding property.

5. A circuit board according to claim 1, further comprising a resin encapsulation section for encapsulating, in resin, the area where the electronic component and the wiring are electrically connected to each other.

6. A circuit board according to claim 1, further comprising an anisotropic conductive film, interposed between the electronic component and the wiring, for electrically connecting the electronic component to the wiring.

7. A circuit board according to claim 1, wherein the base and the wiring are bonded together with no intervening adhesive layer interposed therebetween.

8. A circuit board according to claim 1, wherein the base comprises a plurality of layers, and the covering section is arranged between the plurality of layers.

9. A display device comprising a circuit board according to claim 1, and a flat panel comprising a connection terminal to which the circuit board is electrically connected.

10. A display device according to claim 9, wherein the flat panel is a liquid-crystal panel comprising a pair of opposing substrates, and a liquid crystal encapsulated between the pair of substrates, and
   the connection terminal is formed at least on one of the pair of substrates.

11. A display device according to claim 9, wherein the electronic component mounted on the wiring board comprises a drive semiconductor device.

12. Electronic equipment comprising a display device according to claim 11, and
   a video signal processing circuit for processing a video signal input to the display device.

13. A circuit board according to claim 1, wherein said electrode of said electronic component opposes said base.

14. A circuit board according to claim 1, wherein said wiring board further comprises an organic film.

15. A circuit board comprising:
   a base being pervious to moisture;
   a wiring formed on said base;
   an electronic component mounted on said base, said electronic component having an active surface;
   an electrode included in said active surface, said electrode being electrically connected to said wiring within said active surface;
   an adhesive agent disposed between said base and said active surface;
   a conductive particle mixed in said adhesive agent, said conductive particle electrically connecting said wiring and said electrode; and
   a cover impervious to moisture, said cover being disposed on said base opposite said electronic component and overlapping said active surface and preventing moisture from reaching said active surface through said base.

16. The circuit board of claim 15 wherein said cover is a dummy wiring layer.

17. A circuit board of claim 16, wherein the dummy wiring layer is grounded.

18. The circuit board of claim 15 wherein said cover is a resin layer.

19. The circuit board of claim 15 wherein said cover is a light shield.

20. The circuit board of claim 15 wherein said base further comprises a plurality of layers, layers, said cover being located between said plurality of layers.

21. A circuit board comprising:
   a moisture pervious base having a first side and a second side;

an electronic component mounted on the first side of the base, said electronic component having an electrode arranged within an active surface of said electronic component;

a wiring arranged on the first side of the base and electrically connected to said electrode;

an adhesive agent disposed between the base and the active surface;

a conductive particle mixed in the adhesive agent, said conductive particle electrically connecting said wiring and said electrode; and an moisture impervious dummy wiring layer formed on the second side of the base opposite the electronic component, the dummy wiring layer overlapping said active surface and preventing moisture from reaching the active surface through said base.

22. The circuit board of claim 21 wherein said interface is located within a periphery of said electronic component.

23. A circuit board comprising:

a moisture pervious base having a first side and a second side;

input wiring extending inboard along said first side of said base;

output wiring extending inboard along said first side of said base;

an IC chip mounted on said first side of said base, said IC chip being electrically connected to said input and output wirings at electrical interfaces within a periphery of said IC chip;

a moisture impervious dummy wiring layer mounted on said second side of said base, said dummy wiring layer overlapping said electrical interfaces and extending at least to said periphery of said IC chip relative to said base.

24. The circuit board of claim 23 wherein said dummy wiring layer extends beyond said periphery of said IC chip relative to said base.

25. The circuit board of claim 23 wherein said periphery of said IC chip borders an active surface of said IC chip.

26. A method for manufacturing a circuit board comprising:

an electronic component mounting step for mounting an electronic component onto a mounting side of a moisture pervious base of a wiring board through pressure bonding, the electronic component having an active surface with an electrode arranged on the active surface, a wiring arranged on the base extending within the active surface and connected to said electrode; and a covering section forming step for forming the covering section to cover the base on the side opposite the mounting side of the base in an area which, at least, partly overlaps the active surface so as to prevent moisture from reaching the active surface through the base, the covering section being electrically isolated from the wiring and the electronic component, the covering section forming step occurring subsequent to the electronic component mounting step;

wherein an adhesive agent is disposed between the base and the active surface, and a conductive particle mixed in said adhesive agent electrically connects the electrode and the wiring.

27. A method for manufacturing a circuit board comprising:

an electronic component mounting step for mounting an electronic component onto a mounting side of a moisture pervious base of a wiring board through pressure bonding, the electronic component having an active surface with an electrode arranged on the active surface, a wiring arranged on the base extending within the active surface and connected to said electrode; and a covering section forming step for forming the covering section to cover the base on the side opposite the mounting side of the base in an area which, at least, partly overlaps the active surface so as to prevent moisture from reaching the active surface through the base, the covering section being electrically isolated from the wiring and the electronic component;

the electronic component mounting step occurring subsequent to the covering section forming step;

wherein an adhesive agent is disposed between the base and the active surface, and a conductive particle mixed in said adhesive agent electrically connects the electrode and the wiring.

* * * * *

UNITED STATES PATENT AND TRADEMARK OFFICE
CERTIFICATE OF CORRECTION

PATENT NO. : 6,542,374 B1
DATED : April 1, 2003
INVENTOR(S) : Muramatsu et al.

It is certified that error appears in the above-identified patent and that said Letters Patent is hereby corrected as shown below:

Column 1,
Line 54, delete "an" and substitute -- a -- therefor;

Column 6,
Line 26, delete "other" and substitute -- another -- therefor;

Column 8,
Line 9, after "under" insert -- side --;

Column 14,
Line 63, delete second occurrence of "layers";

Column 15,
Line 13, delete "an" and substitute -- a -- therefor.

Signed and Sealed this

Twenty-first Day of October, 2003

JAMES E. ROGAN
*Director of the United States Patent and Trademark Office*